US012776363B2

(12) United States Patent
Jung et al.

(10) Patent No.: US 12,776,363 B2
(45) Date of Patent: Oct. 27, 2026

(54) INPUT OFFSET DETECTION AMPLIFICATION CIRCUIT AND SEMICONDUCTOR MEMORY DEVICE INCLUDING SAME

(71) Applicant: UIF (University Industry Foundation), Yonsei University, Seoul (KR)

(72) Inventors: Seong Ook Jung, Seoul (KR); Do Yoon Lim, Seoul (KR); Sehee Lim, Seoul (KR); Donghan Ko, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 139 days.

(21) Appl. No.: 19/005,706

(22) Filed: Dec. 30, 2024

(65) Prior Publication Data

US 2025/0239297 A1 Jul. 24, 2025

(30) Foreign Application Priority Data

Jan. 19, 2024 (KR) ........................ 10-2024-0008959
Dec. 27, 2024 (KR) ........................ 10-2024-0198387

(51) Int. Cl.
*G11C 11/40* (2006.01)
*G11C 11/4091* (2006.01)

(52) U.S. Cl.
CPC ................................ *G11C 11/4091* (2013.01)

(58) Field of Classification Search
CPC ........................ G11C 11/4091; G11C 11/4094
See application file for complete search history.

(56) References Cited

U.S. PATENT DOCUMENTS

| | | | | |
|---|---|---|---|---|
| 2006/0262622 | A1 | 11/2006 | Forbes | |
| 2008/0316840 | A1* | 12/2008 | Kim | G11C 7/1096 365/208 |
| 2020/0035285 | A1 | 1/2020 | Vimercati | |
| 2020/0075065 | A1 | 3/2020 | Jeong et al. | |

FOREIGN PATENT DOCUMENTS

| | | | |
|---|---|---|---|
| KR | 10-2004-0038449 | A | 5/2004 |
| KR | 20180042881 | A | 4/2018 |
| KR | 10-2478757 | B1 | 12/2022 |

OTHER PUBLICATIONS

Korean Patent Office Action for Application No. 10-2024-0198387 dated Feb. 25, 2026 (10 pages including partial English translation).

(Continued)

*Primary Examiner* — Xiaochun L Chen

(74) *Attorney, Agent, or Firm* — Michael Best & Friedrich LLP

(57) ABSTRACT

According to various embodiments of the present invention, an input/output sense amplifier circuit in a sense amplifier circuit includes a 1-1 transistor having a source connected to a first global input/output line, a 1-2 transistor having a source connected to a second global input/output line, and a metal-oxide-semiconductor capacitor (MOSCAP) configured to connect a gate of the 1-1 transistor to a gate of the 1-2 transistor.

18 Claims, 12 Drawing Sheets

100

(56) References Cited

OTHER PUBLICATIONS

Boley et al., Int'l Symposium on Quality Electronic Design, "Stack Based Sense Amplifier Designs for Reducing Input-Referred Offset", dated Mar. 2015 (4 pages).

Abstract, Kim et al., "A 16Gb 9.5Gb/S/pin LPDDR5X SDRAM With LowPower Schemes Exploiting Dynamic Voltage Frequency Scaling and Offset Calibrated Readout Sense Amplifiers in a Fourth Generation 10nm DRAM Process", 2022 IEEE International Solid-State Circuits Conference (ISSCC), San Francisco, CA, USA, 2022 (1 page).

Moon et al., "1.2V 1.6Gb/s 56nm 6F2 4Gb DDR3 SDRAM withHybrid-I/O Sense Amplifier and Segmented Sub-Array Architecture", 2009 IEEE International Solid-State Circuits Conference, Digest of Technical Papers, San Francisco, CA, USA, 2009, pp. 128-129, 129a (3 pages).

Giridhar et al., "A Reconfigurable Sense Amplifier with Auto-Zero Calibration and Pre-Amplification in 28nm CMOS", 2014 IEEE International Solid-State Circuits Conference Digest of Technical Papers (ISSCC), San Francisco, CA, USA, 2014, pp. 242-243 (3 pages).

Kim et al., "A 1.5V, 1.6Gb/s/pin, 1Gb DDR3 SDRAM with an Address Queuing Scheme and Bang-Bang Jitter Reduced DLL Scheme", 2007 IEEE Symposium on VLSI Circuits, Kyoto, Japan, 2007, pp. 182-183 (2 pages).

Korean Patent Office Action for Application No. 10-2024-0198387 dated Aug. 6, 2025 (13 pages including English translation).

* cited by examiner

*VDD = 1 V, MINIMUM VALUE BASED ON YIELD 100%

| | OC-IOSA | Proposed IOSA |
|---|---|---|
| Journal | 2022 ISSCC | - |
| Affiliation | Samsung | Yonsei |
| Pre-Sense | X | O |
| Offset | 10.18mV | 5.41mV |
| Area | 46.14um$^2$ | 10.08um$^2$ |
| Power | 6.76uW | 4.45uW |
| Sensing Time* | 4.95ns | 3.67ns |

FIG. 12

| | OC-IOSA | Proposed IOSA |
|---|---|---|
| Offset | OFFSET NOT CONSIDERED FOR Non-OC TR<br>2) DATA IS TRANSMITTED THROUGH INPUT COUPLING<br>→ INPUT ATTENUATION OCCURS | 1) PRE-SENSE IS ADDED<br>→ OFFSET OF Non-OC TR IS REDUCED<br>2)INPUT IS DIRECTLY TRANSMITTED<br>→ INPUT ATTENUATION IS ELIMINATED |
| Area | LARGE MOSCAP IS USED TO REDUCE INPUT ATTENUATION<br>→ AREA OVERHEAD OCCURS | INPUT IS DIRECTLY TRANSMITTED<br>→ SMALL MOSCAP IS USED |
| Power | 1) GATE VOLTAGE IS NOT FULLY DRIVEN TO VDD/GND DESPITE THE COUPLING OF MOSCAP IS USED IN MAIN-SENSE → STATIC CURRENT IS GENERATED | 1) MOSCAP IS DISCONNECTED FROM MAIN-SENSE TO DRIVE GATE VOLTAGE TO VDD/GND<br>→ STATIC CURRENT IS ELIMINATED<br>2) STATIC CURRENT IS ELIMINATED IN PRE-SENSE<br>→ PRE-SENSE POWER OVERHEAD IS REDUCED |
| Sensing Time | LARGE MOSCAP IS USED<br>→ LONG OC TIME IS REQUIRED | 1) SMALL MOSCAP IS USED<br>→ TIME REQUIRED FOR OC IS REDUCED<br>2) INPUT PHASE IS PERFORMED SIMULTANEOUSLY IN PULL DOWN AND PRE-SENSE PHASE<br>→ SENSING TIME OVERHEAD IS REDUCED |

FIG. 13

INPUT OFFSET DETECTION AMPLIFICATION CIRCUIT AND SEMICONDUCTOR MEMORY DEVICE INCLUDING SAME

CROSS-REFERENCE TO RELATED APPLICATION

This application claims priority to and the benefit both of Korean Patent Application No. 2024-0008959 filed on Jan. 19, 2024, and No. 2024-0198387 filed on Dec. 27, 2024, the disclosures of which are incorporated herein by reference in their entirety.

TECHNICAL FIELD

The present invention relates to an input/output sense amplifier circuit and a semiconductor memory device including the same.

BACKGROUND ARE OF THE INVENTION

The content described in this section simply provides background information for embodiments of the present invention and does not constitute the related art.

An input/output sense amplifier (IOSA) circuit is one sense amplifier circuit and is used to sense and correct an input offset voltage that may occur during a dynamic random access memory (DRAM) data reading process. An IOSA circuit is particularly important in application fields that require precise measurement and control.

An IOSA circuit senses small mismatches or imbalances between two input terminals of an operational amplifier circuit and automatically adjusts the sensed mismatches or imbalances to improve the overall performance of the operational amplifier circuit.

Conventional IOSA circuits have several major problems. First, a sensing yield tends to decrease as an offset of the IOSA circuit increases due to process, voltage, and temperature (PVT) variations. This means a decrease in sensing efficiency. Second, in order to improve a sensing yield, a strength required to drive a long global input/output (GIO) line should be large. This leads to an increase in power consumption of a GIO line and power consumption of the IOSA circuit itself.

Previous studies have proposed two methods to solve these problems. A first proposed method is a self-timed method IOSA circuit, in which an IOSA circuit transmits sensed data to a set-reset (SR) latch, and when the data is stored in the SR latch, a turn-off signal is generated to turn off the IOSA circuit. A second proposed method is a hybrid IOSA circuit, in which a pre-amplifier determines a voltage input of a main amplifier and determines an N-type metal-oxide-semiconductor (NMOS) (N-channel metal-oxide semiconductor field-effect transistor (MOSFET)) operation of the main amplifier. This reduces current consumption and improves speed, but these IOSA circuits require large voltage swings in a GIO line for robust detection, which causes a GIO line driving power problem as a GIO line driving strength increases.

PRIOR ART DOCUMENT

Patent Document (Patent Document 0001) Korean Patent Registration No. 10-2589761 (Published on Oct. 11, 2023)

Non-Patent Document (Non-patent Document 0001) Dae-Hyun Kim, et al., "A 16 Gbit 9.5 Gb/s/pin LPDDR5X SDRAM with Low-Power Schemes Exploiting Dynamic Voltage Frequency Scaling and Offset-Calibrated Readout Sense Amplifiers in a Fourth Generation 10 nm DRAM Process," ISSCC 2022

(Non-patent Document 0002) Y. Kim et al., "A1.5V, 1.6 Gb/s/pin, 1 Gb DDR3 SDRAM with an Address Queuing Scheme and Bang-Bang Jitter Reduced DLL Scheme," SVLSI 2007

(Non-patent Document 0003) Y. Moon et al., "1.2V 1.6 Gbps 56 nm 6F 2 4 Gb DDR3 SDRAM with Hybrid IO Sense Amplifier and Segmented Sub-Array Architecture," ISSCC 2009

(Non-patent Document 0004) Bharan Giridhar, et al., "A Reconfigurable Sense Amplifier with Auto-Zero Calibration and Pre-Amplification in 28 nm CMOS," ISSCC 2013

(Non-patent Document 0005) James Boley, et al., "Stack Based Sense Amplifier Designs for Reducing Input-Referred Offset," IEEE Journal of Solid-state Circuits, ISQED 2015

Contents of the Invention

Technical Problem

The present invention is directed to providing an input/output sense amplifier circuit that is capable of eliminating input attenuation, reducing an area of a circuit, reducing a time required for offset cancellation (OC), and reducing a sensing time by connecting an input directly to the source of a P-type metal oxide-semiconductor (PMOS) and connecting one small metal-oxide-semiconductor capacitor (MOSCAP) between two gates of the PMOS to which inputs are connected, and a semiconductor memory device including the same.

Other unspecified objects of the present invention may be additionally considered within a scope that can be easily inferred from the following detailed description and its effects.

Technical Solution

According to an aspect of the present invention, there is provided an input/output sense amplifier circuit in a sense amplifier circuit, which includes a 1-1 transistor having a source connected to a first global input/output line, a 1-2 transistor having a source connected to a second global input/output line, and a metal-oxide-semiconductor capacitor (MOSCAP) configured to connect a gate of the 1-1 transistor to a gate of the 1-2 transistor.

Here, the input/output sense amplifier circuit may further include a 2-1 transistor configured to connect the MOSCAP to the 1-1 transistor through a 1-1 node connected to the gate of the 1-1 transistor, and a 2-2 transistor configured to connect the MOSCAP to the 1-2 transistor through a 1-2 node connected to the gate of the 1-2 transistor.

Here, the input/output sense amplifier circuit may further include a 1-1 switch configured to connect or disconnect a 2-1 node connected to a drain of the 1-1 transistor to or from the 1-1 node, and a 1-2 switch configured to connect or disconnect a 2-2 node connected to a drain of the 1-2 transistor to or from the 1-2 node.

Here, the input/output sense amplifier circuit may further include a 2-1 switch configured to connect or disconnect a 3-2 node located between the 1-2 node and the 1-2 switch to or from the 2-1 node, and a 2-2 switch configured to connect or disconnect a 3-1 node located between the 1-1 node and the 1-1 switch to or from the 2-2 node.

Here, the input/output sense amplifier circuit may further include a 3-1 transistor having a gate connected to the 2-2 node and a source connected to the 2-1 node, and a 3-2 transistor having a gate connected to the 2-1 node and a source connected to the 2-2 node.

Here, a drain of the 3-1 transistor and a drain of the 3-2 transistor may be connected through a fourth node, the fourth node may be connected to a source of the fifth transistor, and a drain of the fifth transistor may be connected to a ground.

Here, the input/output sense amplifier circuit may further include a 4-1 transistor having a source connected to the 2-1 node and a drain connected to the ground, and a 4-2 transistor having a source connected to the 2-2 node and a drain connected to the ground.

Here, the 1-1 transistor may be connected to the first global input/output line through a 5-1 transistor connected to the source of the 1-1 transistor, and the 1-2 transistor may be connected to the second global input/output line through a 5-2 transistor connected to the source of the 1-2 transistor.

Here, the 4-1 transistor may be a transistor having a different channel type from the 5-1 transistor, and the 4-2 transistor may be a transistor having a different channel type from the 5-2 transistor.

Here, a gate of the 4-1 transistor, a gate of the 4-2 transistor, a gate of the 5-1 transistor, and a gate of the 5-2 transistor may receive the same signal.

The input/output sense amplifier circuit may further include a controller that controls the input/output sense amplifier circuit, wherein the controller may turn off the 5-1 transistor and the 5-2 transistor, turn on the 1-1 switch and the 1-2 switch, turn on the 4-1 transistor and the 4-2 transistor, and turn on the 2-1 transistor and the 2-2 transistor.

The controller may turn on the 1-1 switch and the 1-2 switch, turn on the 2-1 transistor and the 2-2 transistor, turn on the 5-1 transistor and the 5-2 transistor, and turn off the 4-1 transistor and the 4-2 transistor.

The controller may turn on the 2-1 transistor and the 2-2 transistor, turn off the 1-1 switch and the 1-2 switch, turn off the 5-1 transistor and the 5-2 transistor, and turn on the 4-1 transistor and the 4-2 transistor.

The controller may turn on the 2-1 transistor and the 2-2 transistor, turn off the 1-1 switch and the 1-2 switch, turn off the 5-1 transistor and the 5-2 transistor, and turn on the 4-1 transistor and the 4-2 transistor.

The controller may turn off the 2-1 transistor and the 2-2 transistor, turn off the 1-1 switch and the 1-2 switch, turn on the 5-1 transistor and the 5-2 transistor, turn off the 4-1 transistor and the 4-2 transistor, turn on the 2-1 switch and the 2-2 switch, turn on the 3-1 transistor and the 3-2 transistor, and turn on the fifth transistor.

According to another aspect of the present invention, there is provided a semiconductor memory device which includes a bit line sense amplifier circuit configured to amplify memory cell data, a local sense amplifier circuit configured to receive the memory cell data amplified by the bit line sense amplifier circuit through a local input/output line, sense data of the local input/output line, and provide the sensed data to a global input/output line, and an input/output sense amplifier circuit configured to receive data from the local sense amplifier circuit through the global input/output line, operate using a MOSCAP, sense data of the global input/output line, and provide the sensed data to the outside of the semiconductor memory device.

The semiconductor memory device may further include a 1-1 transistor having a source connected to a first global input/output line, a 1-2 transistor having a source connected to a second global input/output line, and a MOSCAP that connects a gate of the 1-1 transistor to a gate of the 1-2 transistor.

Here, the semiconductor memory device may further include a 1-1 switch configured to connect or disconnect a 2-1 node connected to a drain of the 1-1 transistor to or from the 1-1 node, and a 1-2 switch configured to connect or disconnect a 2-2 node connected to a drain of the 1-2 transistor to or from the 1-2 node.

Effects of the Invention

As described above, according to an embodiment of the present invention, by applying an input/output sense amplifier circuit and a semiconductor memory device including the same, the input is directly connected to a PMOS source, and a small MOSCAP (Metal-Oxide-Semiconductor Capacitor) is connected between the two PMOS gates where the input is connected, thereby eliminating input attenuation and reducing the circuit area.

Furthermore, according to an embodiment of the present invention, by applying an input/output sense amplifier circuit and a semiconductor memory device including the same, the time required for offset cancellation (OC) can be reduced, and the sensing time can be shortened.

Even effects not explicitly mentioned here are treated as the effects described in the following specification, along with their potential effects, as expected due to the technical features of the present invention.

BRIEF DESCRIPTION OF THE DRAWINGS

FIGS. 12 and 13 are diagrams showing tables obtained by comparing the characteristics of an input/output sense amplifier circuit according to one embodiment of the present invention with the characteristics of a sense amplifier circuit according to the related art.

DETAILED DESCRIPTION OF EXEMPLARY EMBODIMENTS

Figure 1:
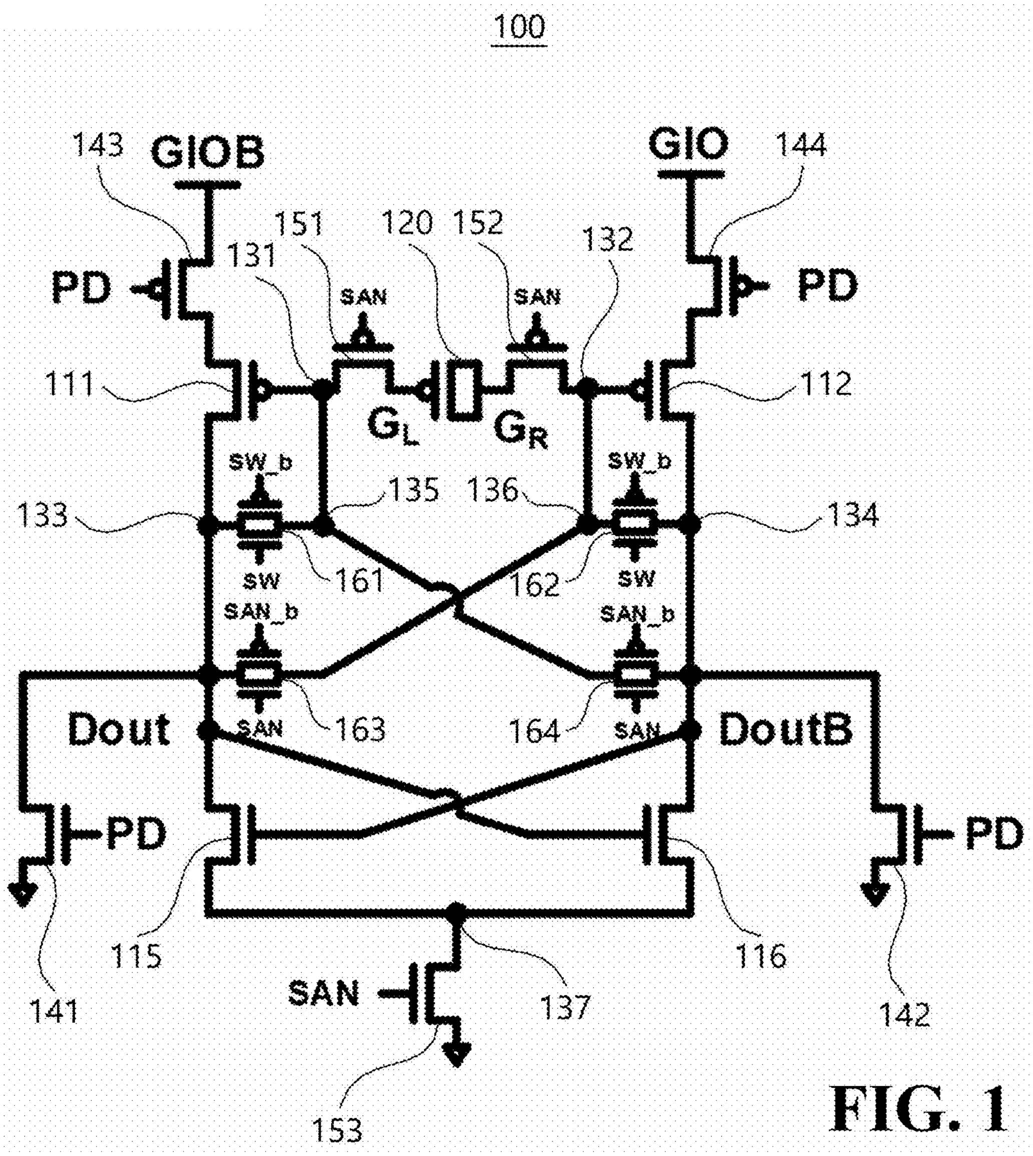
FIG. 1 is a diagram for describing a configuration of an input/output sense amplifier circuit according to one embodiment of the present invention.

Advantages and features of the present invention and methods of achieving the same will be clearly understood with reference to the accompanying drawings and embodiments described in detail below. However, the present invention is not limited to the embodiments described herein but may be implemented in various different forms. merely, These embodiments are provided to explain in detail the technical idea of the present invention to those skilled in the art to which the present invention pertains so that the technical idea of the present invention may be easily practiced.

In the drawings, the embodiments of the present invention are not limited to the specific forms shown and are exaggerated for clarity. Further, portions indicated by the same reference numerals throughout the specification represent the same components.

The term "and/or" is used herein to mean at least one of components listed before and after. Further, the meaning of the expression "connected/coupled" includes direct connection to another component and indirect connection through another component. In this specification, the singular forms include the plural forms unless the context clearly indicates otherwise. Further, it will be understood that the terms "comprise" or "comprising" when used herein specify some stated components, steps, operations, and elements but do not preclude the presence or addition of one or more other components, steps, operations, and elements.

Hereinafter, various embodiments of an input/output sense amplifier (IOSA) circuit and a semiconductor memory device including the same according to the present invention will be described in detail with reference to the accompanying drawings.

The IOSA circuit according to the present invention may be a dynamic random access memory (DRAM) IOSA circuit using power efficient pre-sense (PS) using gate boosting.

FIG. 1 is a diagram for describing a configuration of an IOSA circuit according to one embodiment of the present invention.

Referring to FIG. 1, an IOSA circuit 100 according to one embodiment of the present invention may include a 1-1 transistor 111, a 1-2 transistor 112, and a metal-oxide-semiconductor capacitor (MOSCAP) 120.

A source of the 1-1 transistor 111 may be connected to a first global input/output (GIO) line GIOB. The 1-1 transistor 111 may be connected to the first GIO line GIOB through a 5-1 transistor 143 connected to the source of the 1-1 transistor 111.

A source of the 1-2 transistor 112 may be connected to a second GIO line GIO. The 1-2 transistor 112 may be connected to the second GIO line GIO through a 5-2 transistor 144 connected to the source of the 1-2 transistor 112.

The MOSCAP 120 may connect a gate of the 1-1 transistor 111 to a gate of the 1-2 transistor 112.

The IOSA circuit 100 according to one embodiment of the present invention may further include a 2-1 transistor 151 and a 2-2 transistor 152.

The 2-1 transistor 151 may connect the MOSCAP 120 to the 1-1 transistor 111 through a 1-1 node 131 connected to the gate of the 1-1 transistor 111.

The 2-2 transistor 152 may connect the MOSCAP 120 to the 1-2 transistor 112 through a 1-2 node 132 connected to the gate of the 1-2 transistor 112.

The IOSA circuit 100 according to one embodiment of the present invention may further include a 1-1 switch 161 and a 1-2 switch 162.

The 1-1 switch 161 may connect or disconnect a 2-1 node 133 connected to a drain of the 1-1 transistor 111 to or from the 1-1 node 131.

The 1-2 switch 162 may connect or disconnect a 2-2 node 134 connected to a drain of the 1-2 transistor 112 to or from the 1-2 node 132.

The IOSA circuit 100 according to one embodiment of the present invention may further include a 2-1 switch 163 and a 2-2 switch 164.

The 2-1 switch 163 may connect or disconnect a 3-2 node 136 located between the 1-2 node 132 and the 1-2 switch 162 to or from the 2-1 node 133.

The 2-2 switch 164 may connect or disconnect a 3-1 node 135 located between the 1-1 node 131 and the 1-1 switch 161 to or from the 2-2 node 134.

The 1-1 switch 161, the 1-2 switch 162, the 2-1 switch 163, and the 2-2 switch 164 may be complementary metal-oxide semiconductor (CMOS) transmission gates, but the present invention is not necessarily limited thereto.

The IOSA circuit 100 according to one embodiment of the present invention may further include a 3-1 transistor 115 and a 3-2 transistor 116.

The 3-1 transistor 115 may have a gate connected to the 2-2 node 134 and a source connected to the 2-1 node 133.

The 3-2 transistor 116 may have a gate connected to the 2-1 node 133 and a source connected to the 2-2 node 134.

A drain of the 3-1 transistor 115 and a drain of the 3-2 transistor 116 may be connected through a fourth node 137. The fourth node 137 may be connected to a source of a fifth transistor 153. A drain of the fifth transistor 153 may be connected to a ground GND.

The IOSA circuit 100 according to one embodiment of the present invention may further include a 4-1 transistor 141 and a 4-2 transistor 142.

The 4-1 transistor 141 may have a source connected to the 2-1 node 133 and a drain connected to the ground.

The 4-2 transistor 142 may have a source connected to the 2-2 node 134 and a drain connected to the ground.

The 4-1 transistor 141 may be a transistor having a different channel type from the 5-1 transistor 143. For example, when the 4-1 transistor 141 is a P-type metal-oxide semiconductor (PMOS), the 5-1 transistor 143 may be an N-type metal-oxide-semiconductor (NMOS).

The 4-2 transistor 142 may be a transistor having a different channel type from the 5-2 transistor 144. For example, when the 4-2 transistor 142 is a PMOS, the 5-2 transistor 144 may be an NMOS.

A gate of the 4-1 transistor 141, a gate of the 4-2 transistor 142, a gate of the 5-1 transistor 143, and a gate of the 5-2 transistor 144 may receive the same signal.

Figure 2:
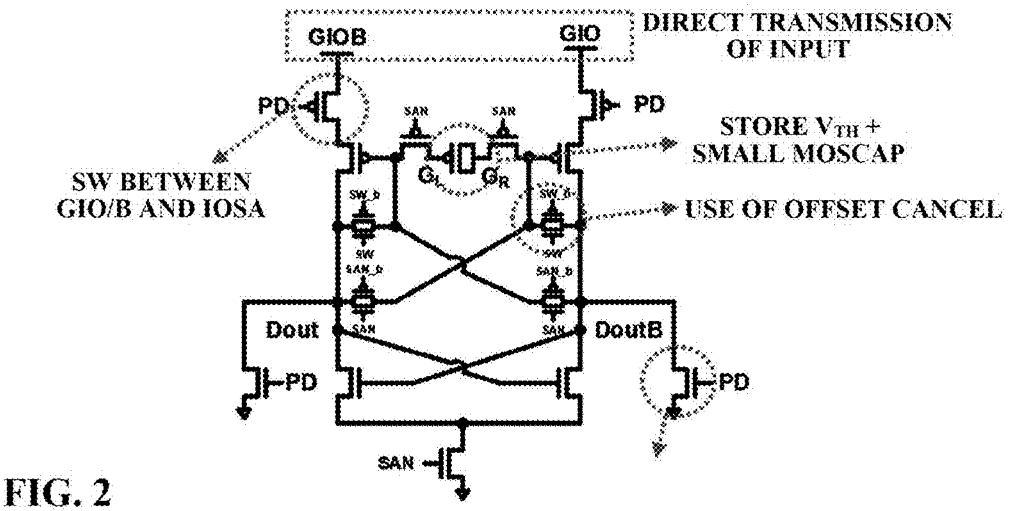
FIG. 2 is a diagram for describing technical features of an input/output sense amplifier circuit according to one embodiment of the present invention.

FIG. 2 is a diagram for describing technical features of an IOSA circuit according to one embodiment of the present invention.

Several major features of the "DRAM IOSA circuit using power efficient PS," which is the present invention, are provided. Referring to FIG. 2, first, the problems faced by the related art may be solved by separating an input from the storage of a threshold voltage $V_{TH}$, directly connecting the input to a PMOS source, and using a small MOSCAP.

Second, by simultaneously performing an input phase using the small MOSCAP in a pull down (PD) phase and a PS phase, a time consumed for offset cancellation (OC) may be reduced, and a sensing time may be reduced because no overhead occurs despite the addition of the phase.

Lastly, by using power efficient PS, the influence of an offset of the non-OC transistor (TR) may be reduced, and the problems of the related art may be solved in the same way with the PS where static current does not flow.

FIGS. 3 to 7 are diagrams for describing operations of an IOSA circuit according to one embodiment of the present invention.

Figure 3:
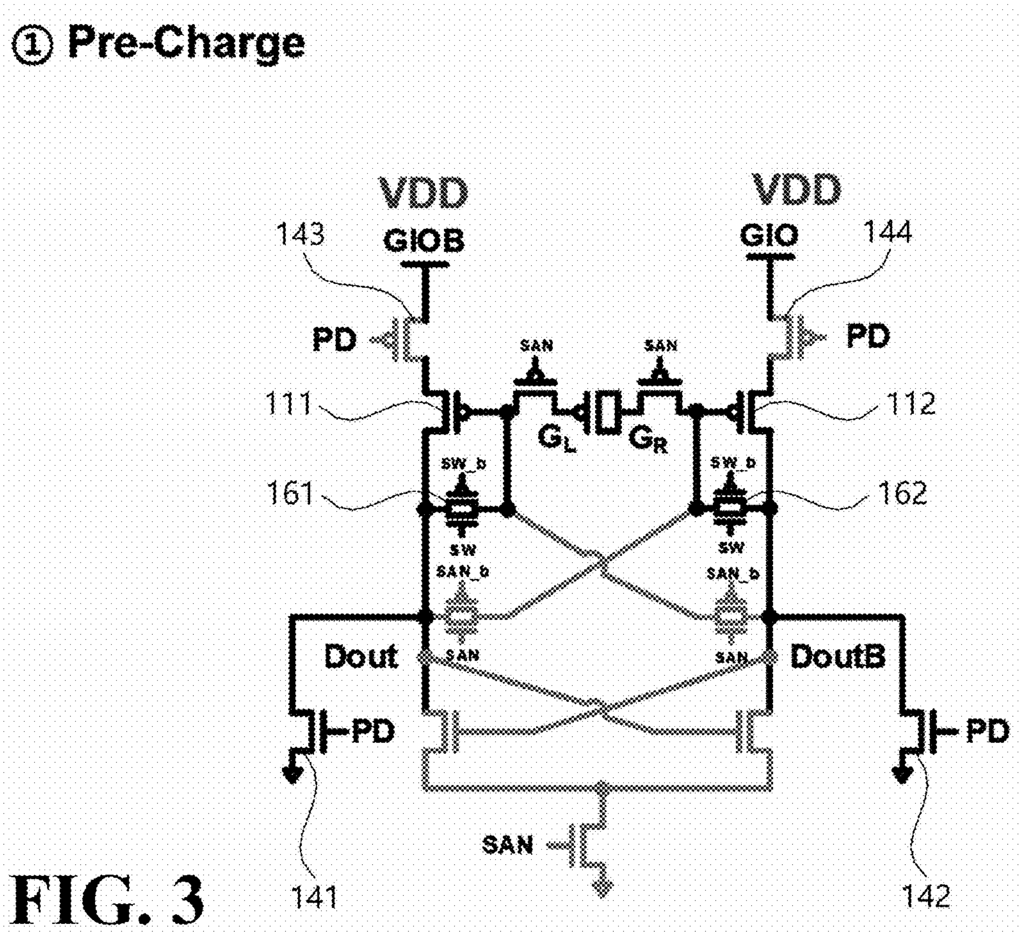
FIGS. 3 to 7 are diagrams for describing operations of an input/output sense amplifier circuit according to one embodiment of the present invention.

FIG. 3 is a diagram for describing a pre-charge operation, which is a first phase operation of the IOSA circuit according to one embodiment of the present invention.

Referring to FIG. 3, a first GIO line GIOB and a second GIO line GIO may be in a state charged with a voltage VDD. During the pre-charge operation, a 5-1 transistor 143 and a 5-2 transistor 144 may be in an OFF state. Further, a 1-1 switch 161 and a 1-2 switch 162 may be in an ON state. Further, a 4-1 transistor 141 and a 4-2 transistor 142 may be in an ON state. Further, a 2-1 transistor 151 and a 2-2 transistor 152 may be in an ON state. Accordingly, gates of a 1-1 transistor 111 and 1-2 transistor 112 may be connected to a ground.

The IOSA circuit may remain in the state of the pre-charge operation until a read operation is performed.

Figure 4:
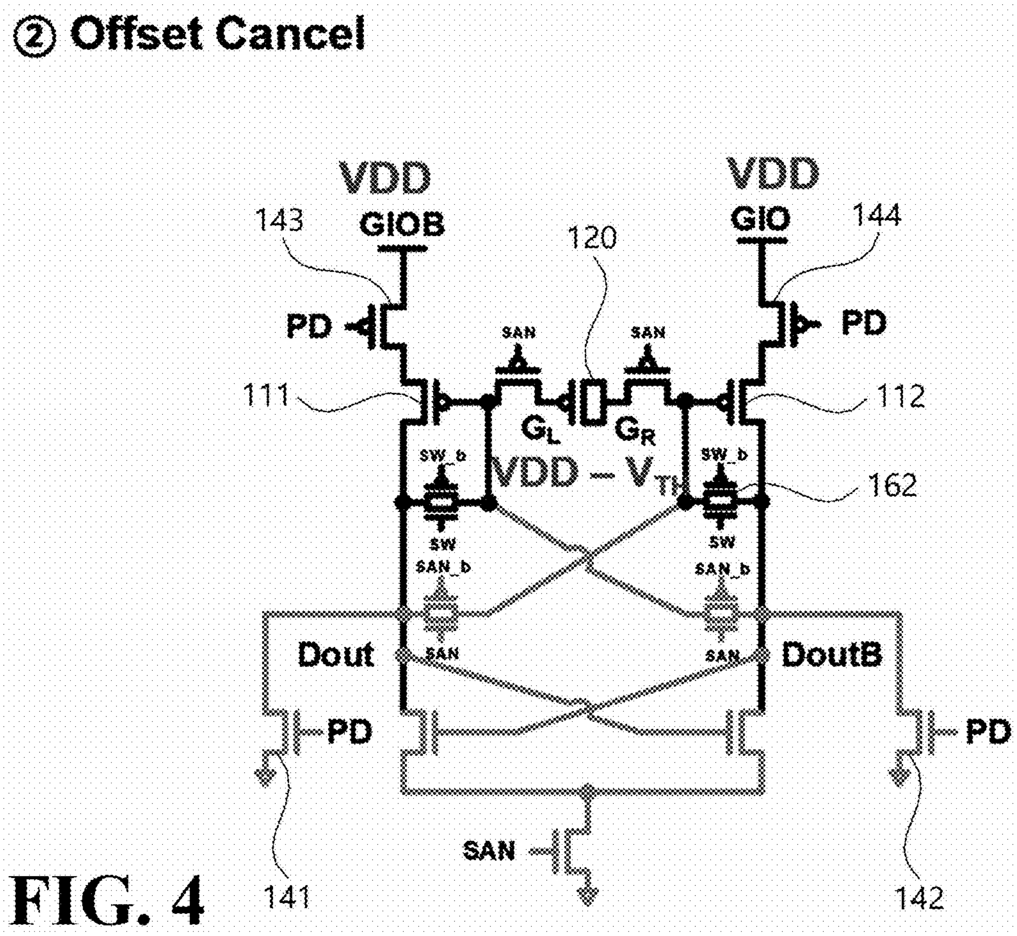

FIG. 4 is a diagram for describing an offset cancel operation, which is a second phase operation performed by the IOSA circuit according to one embodiment of the present invention following the pre-charge operation.

Referring to FIG. 4, the 5-1 transistor 143 and the 5-2 transistor 144 that were in the OFF state during the pre-charge operation may turn ON, and the 4-1 transistor 141 and the 4-2 transistor 142 that were in the ON state during the pre-charge operation may turn OFF.

Accordingly, a voltage VDD-$V_{THL}$ may be stored in the gate of the 1-1 transistor 111.

Here, a voltage $V_{THL}$ may be a voltage $V_{TH}$ of the 1-1 transistor 111. Further, accordingly, a voltage VDD-$V_{THR}$ may be stored in the gate of the 1-2 transistor 112. Here, a voltage $V_{THR}$ may be a voltage $V_{TH}$ of the 1-2 transistor 112.

Accordingly, a voltage $V_{TH}$ difference (i.e., a difference between the voltage $V_{THL}$ and the voltage $V_{THR}$) between the 1-1 transistor 111 and the 1-2 transistor 112 may be stored in a MOSCAP 120.

Figure 5:
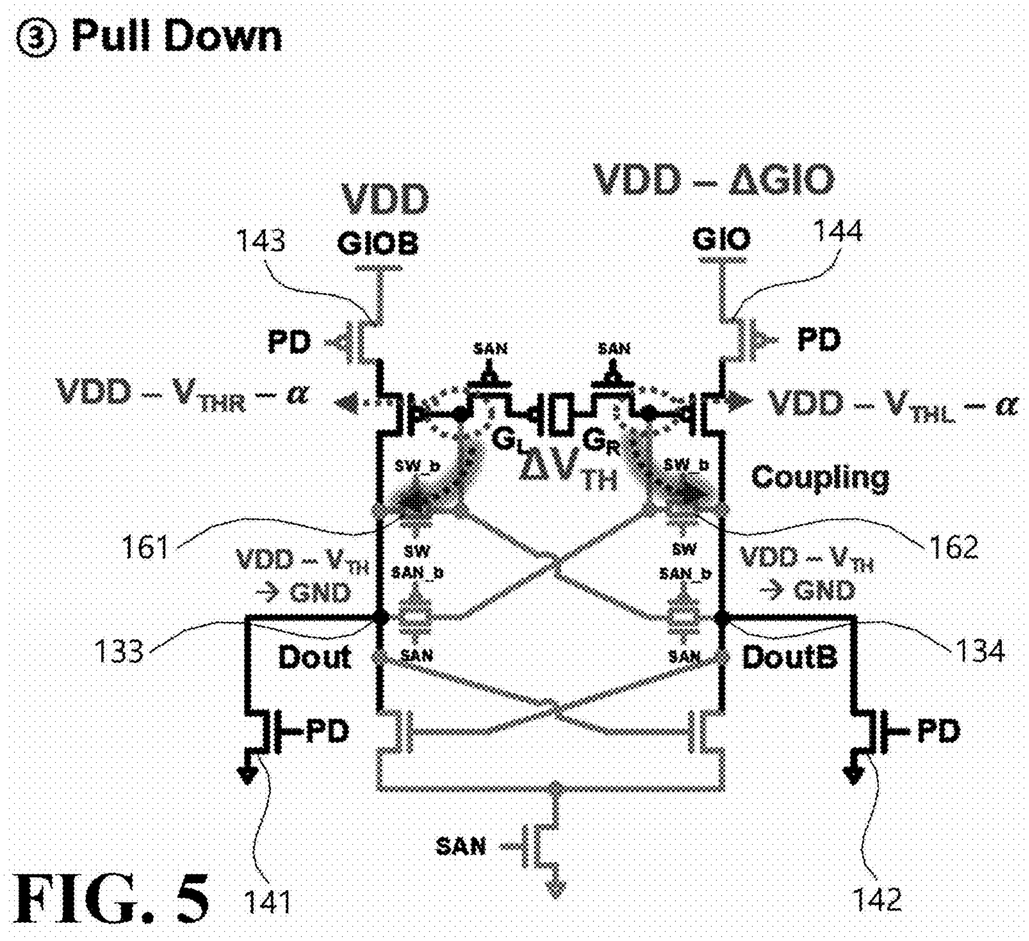

FIG. 5 is a diagram for describing a PD operation, which is a third phase operation performed by the IOSA circuit according to one embodiment of the present invention following the offset cancel operation.

In the PD operation, first, the 1-1 switch 161 and the 1-2 switch 162 that were in the ON state during the pre-charge operation and offset cancel operation may turn OFF.

Accordingly, the gates of the 1-1 transistor 111 and 1-2 transistor 112 may be floated.

Next, as in the pre-charge operation, the 5-1 transistor 143 and the 5-2 transistor 144 may turn OFF again, and the 4-1 transistor 141 and the 4-2 transistor 142 may turn ON. Accordingly, a 2-1 node 133 and a 2-2 node 134, which were each stored with a voltage VDD-$V_{TH}$, may be connected to the ground and discharged.

In the PD operation, coupling occurs due to parasitic capacitance between the gate and drain of each of the 1-1 transistor 111 and 1-2 transistor 112. As the coupling occurs, the voltage stored in the gate of the 1-1 transistor 111 may be lowered from VDD-$V_{THL}$ to VDD-$V_{THL}$-α, and the voltage stored in the gate of the 1-2 transistor 112 may be lowered from VDD-$V_{THR}$ to VDD-$V_{THR}$-α.

The 5-1 transistor 143 and the 5-2 transistor 144 may turn OFF, and input voltages VDD and VDD-ΔGIO may be formed on the first GIO line GIOB and the second GIO line GIO, respectively. ΔGIO may denote a voltage difference between the first GIO line GIOB and the second GIO line GIO.

Figure 6:
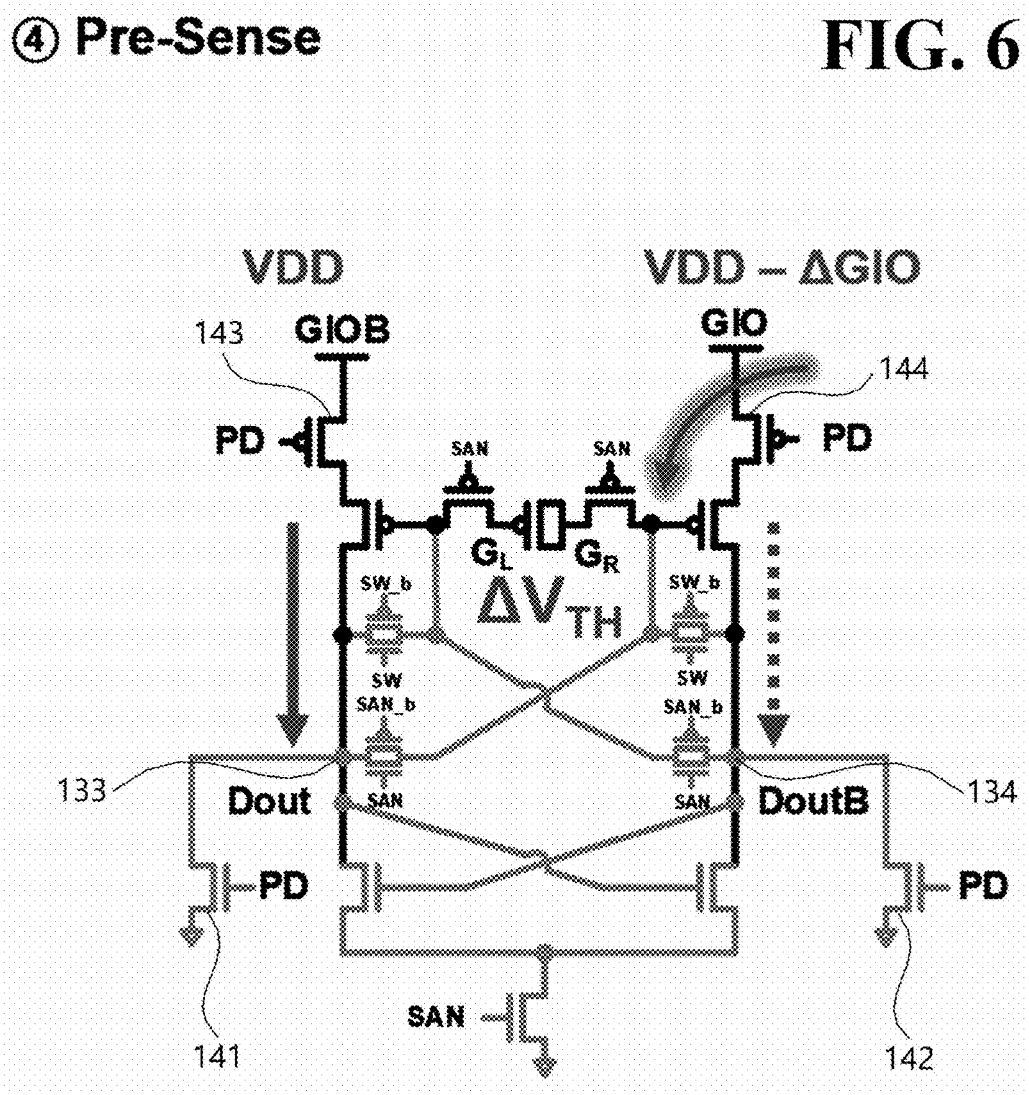

FIG. 6 is a diagram for describing a PS operation, which is a fourth phase operation of the IOSA circuit according to one embodiment of the present invention following the PD operation.

In the PS operation, the 5-1 transistor 143 and the 5-2 transistor 144 that were in the OFF state during the PD operation may turn ON again, and the 4-1 transistor 141 and the 4-2 transistor 142 that were in the ON state during the PD operation may turn OFF.

Accordingly, the 2-1 node 133 (Dout) may be charged by a voltage difference between the source and gate of the 1-1 transistor 111, and the 2-2 node 134 (DoutB) may be charged by a voltage difference between the source and gate of the 1-2 transistor 112. The voltage charged to the 2-2 node 134 (DoutB) may be smaller than the voltage charged to the 2-1 node 133 (Dout).

Figure 7:
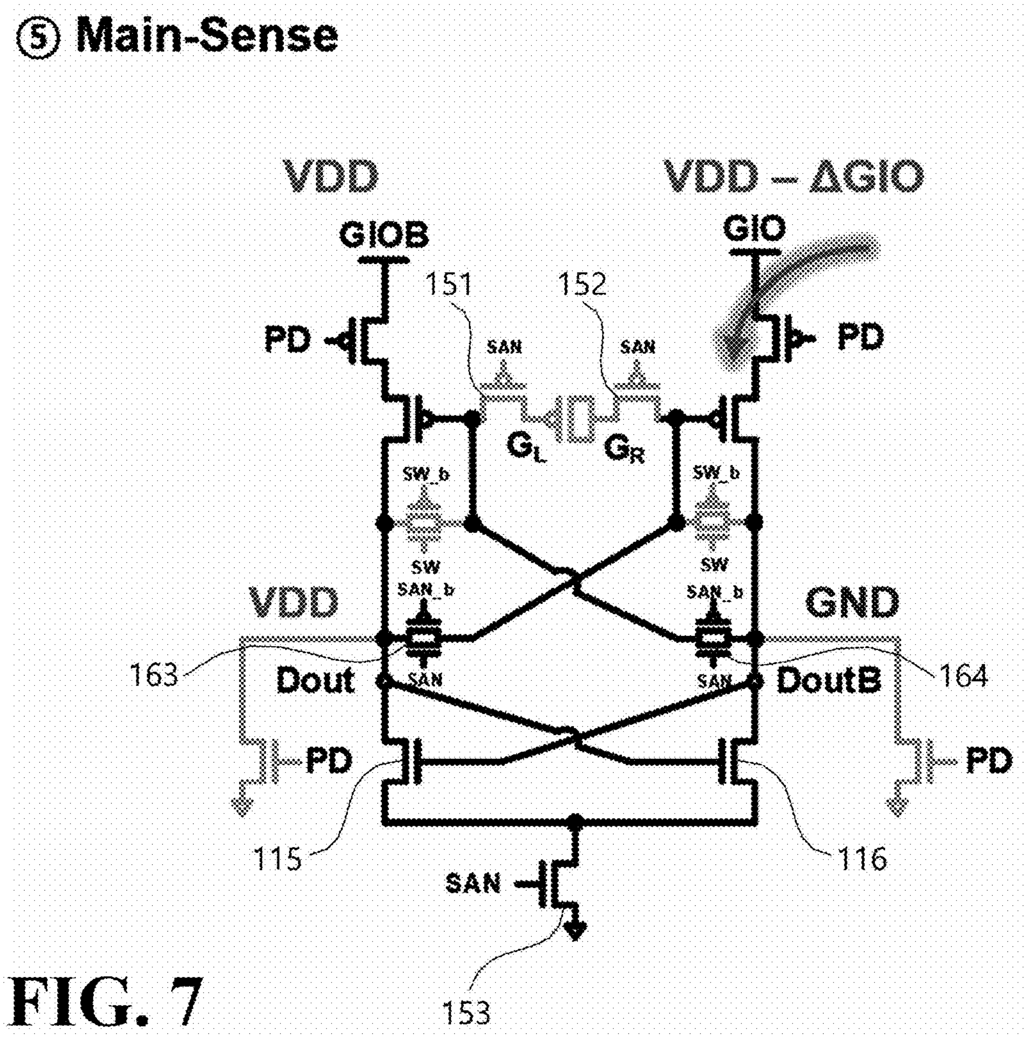

FIG. 7 is a diagram for describing a main-sense (MS) operation, which is a fifth phase operation of the IOSA circuit according to one embodiment of the present invention following the PS operation.

In the MS operation, the 2-1 transistor 151 and the 2-2 transistor 152 that were in the ON state during all the previous operations may turn OFF.

Further, in the MS operation, a 2-1 switch 163, a 2-2 switch 164, a 3-1 transistor 115, a 3-2 transistor 116, and a fifth transistor 153 that were in an OFF state during all the previous operations may turn ON.

Accordingly, the voltage charged to the first GIO line GIOB may be input to a gate of the 3-2 transistor 116, and the voltage charged to the second GIO line GIO may be input to a gate of the 3-1 transistor 115.

Figure 8:
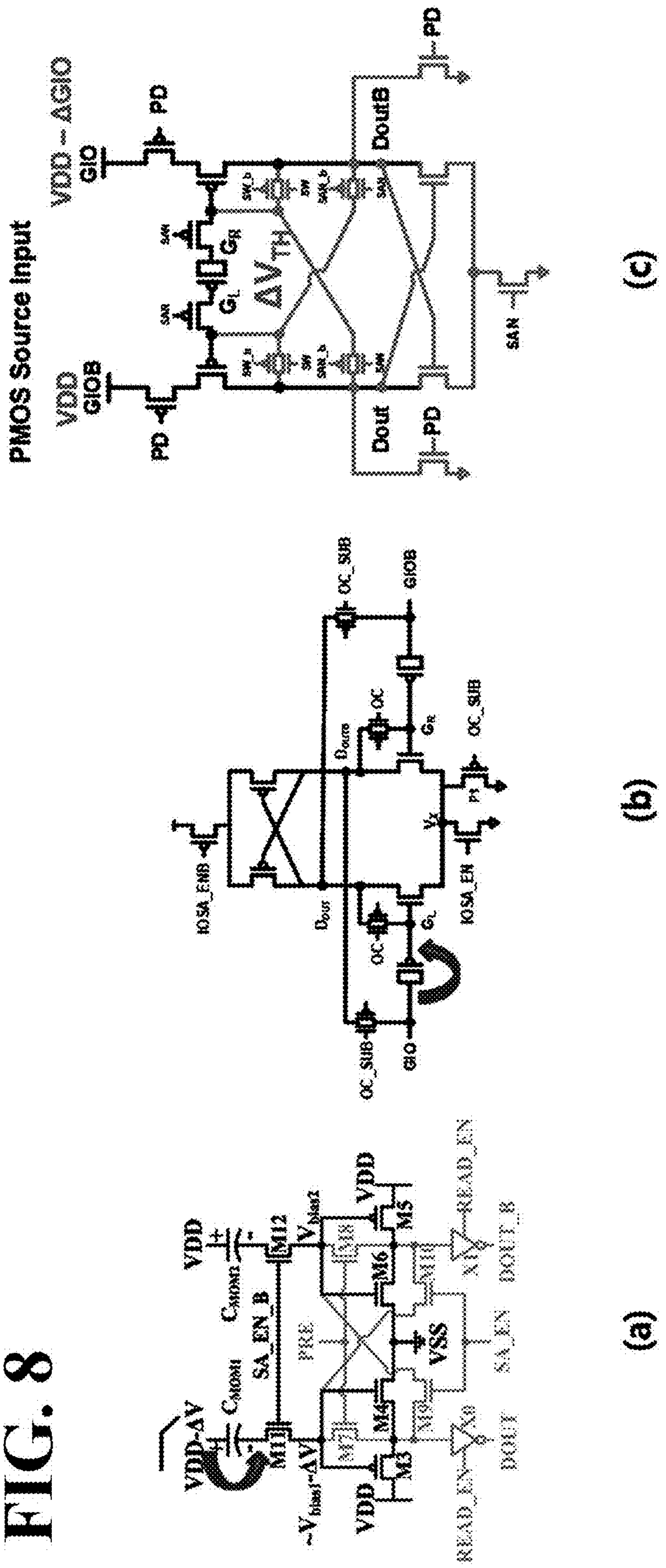
FIG. 8 is a set of diagrams showing a comparison of an input/output sense amplifier circuit according to one embodiment of the present invention with sense amplifier circuits according to the related art.

FIG. 8 is a set of diagrams showing a comparison of an IOSA circuit according to one embodiment of the present invention with sense amplifier circuits according to the related art.

FIG. 8A is a diagram showing a conventional static random access memory (SRAM) bit line sense amplifier (BLSA) circuit, FIG. 8B is a diagram showing a conventional DRAM IOSA circuit, and FIG. 8C is a diagram showing the IOSA circuit according to the present invention.

In previous technologies, a large capacitor (CAP) was used to reduce input attenuation, but in the present invention, an input and the storage of a threshold voltage $V_{TH}$ are separated and the input is directly transmitted to a PMOS source. This may eliminate the need for a large CAP, resulting in eliminating input attenuation and reducing an area.

Figure 9:
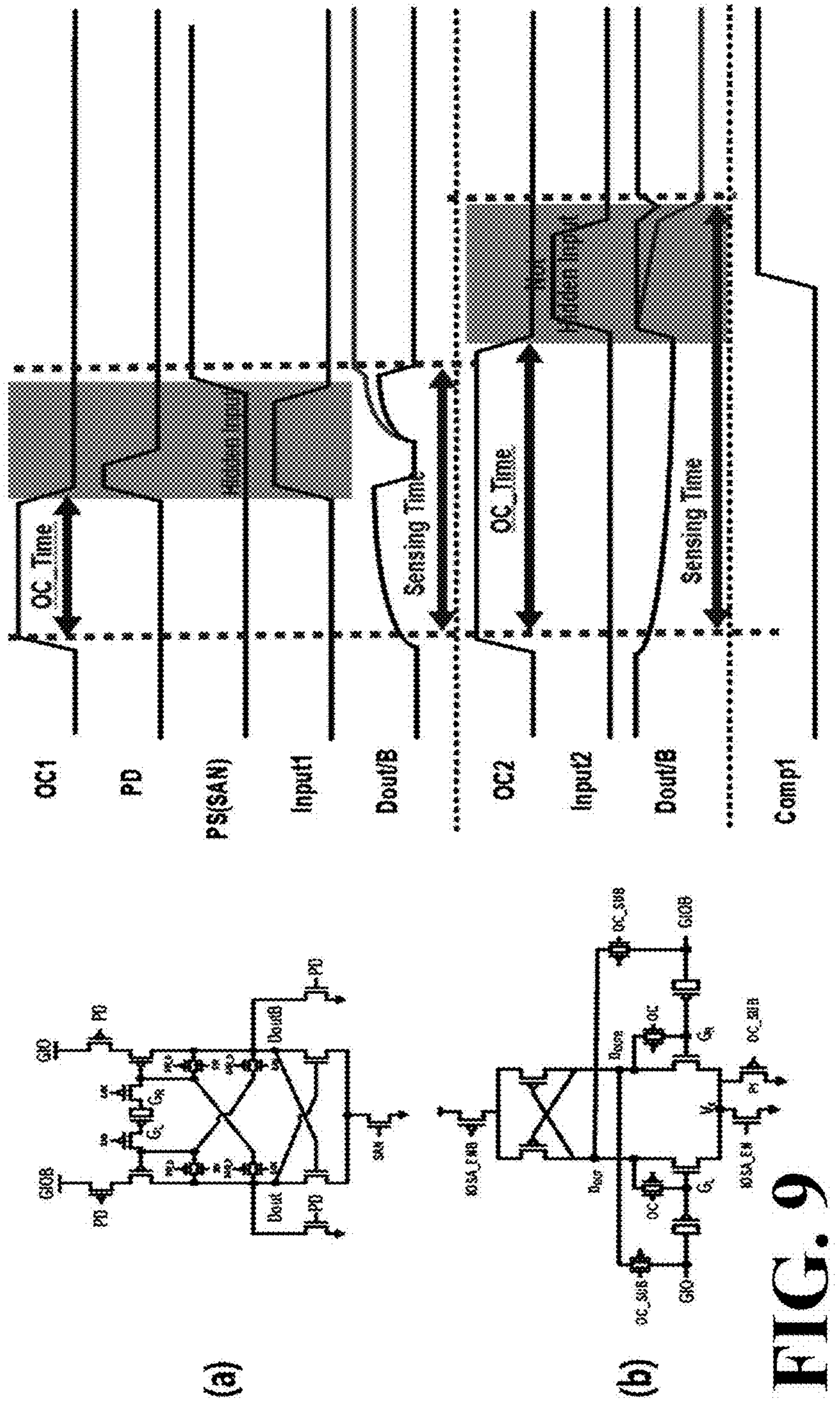
FIG. 9 is a set of diagrams showing operating waveforms of an input/output sense amplifier circuit according to one embodiment of the present invention with a sense amplifier circuit according to the related art.
Figure 10:
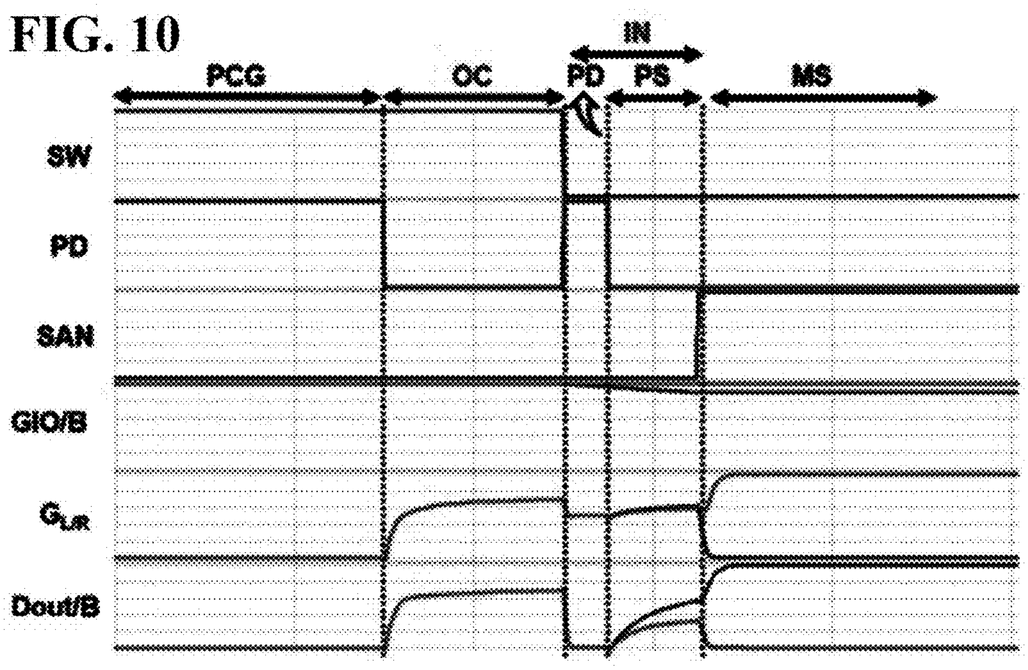
FIG. 10 is a diagram showing operation waveforms of an input/output sense amplifier circuit according to one embodiment of the present invention, divided according to operation phases of the input/output sense amplifier circuit.

FIG. 9 is a set of diagrams showing operating waveforms of an IOSA circuit according to one embodiment of the present invention with a sense amplifier circuit according to the related art. FIG. 10 is a diagram showing operation waveforms of an IOSA circuit according to one embodiment of the present invention, divided according to operation phases of the input/output sense amplifier circuit.

The IOSA circuit of the present invention uses a small CAP, which shortens a time required for OC. The IOSA circuit of the present invention may provide inputs in PD and PS phases and thus a sensing time may be reduced. Accordingly, the IOSA circuit of the present invention may be combined with a small MOSCAP overall and thus the efficiency and speed of a sensing process may be improved.

In FIG. 10, PCG may denote the pre-charge operation described through FIG. 3, OC may denote the offset cancel operation described through FIG. 4, PD may denote the PD operation described through FIG. 5, PS may denote the PS operation described through FIG. 6, and MS may denote the MS operation described through FIG. 7.

Figure 11:
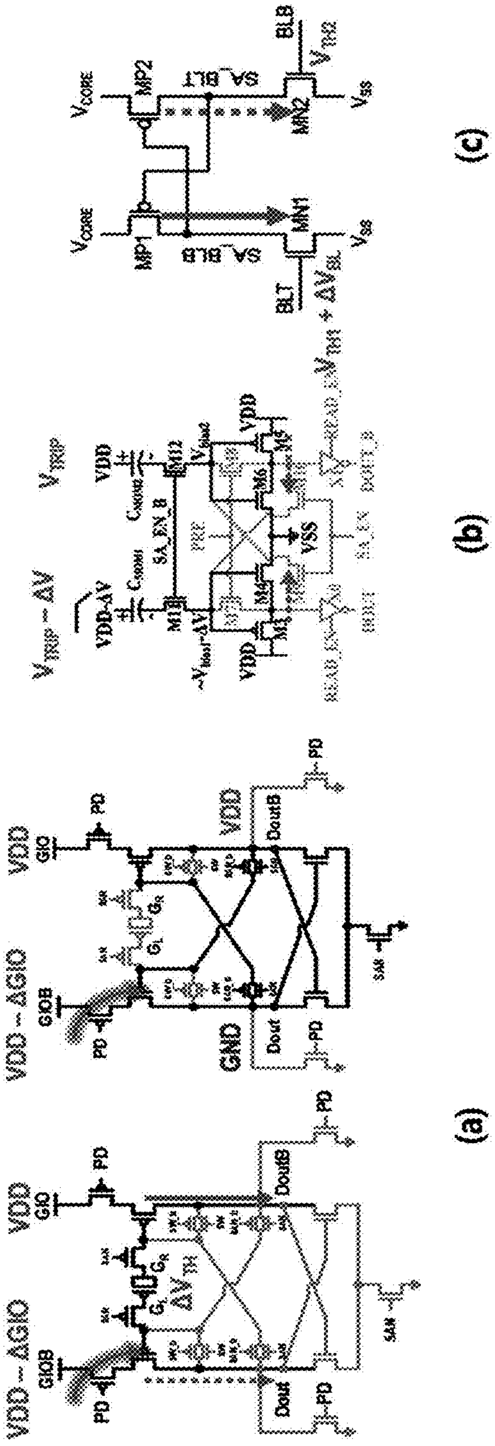
FIG. 11 is a set of diagrams showing a comparison of an input/output sense amplifier circuit according to one embodiment of the present invention with sense amplifier circuits according to the related art.

FIG. 11 is a set of diagrams showing a comparison of an IOSA circuit according to one embodiment of the present invention with sense amplifier circuits according to the related art.

FIG. 11A is a diagram showing an IOSA circuit according to the present invention, FIG. 11B is a diagram showing an SRAM BLSA circuit, and FIG. 11C is a diagram showing a DRAM BLSA circuit.

In the IOSA circuit of the present invention, a gate voltage of an NMOS may be developed through a power efficient PS function to reduce the influence of variation of a threshold voltage $V_{TH}$ of a non-OC TR. Two inputs may be used in an MS phase. The voltage developed in the PS phase may be provided as a gate input, and another input may be provided as a PMOS source. By providing these two inputs simultaneously in the MS phase, an offset may be reduced.

Unlike the previous PS structures (e.g., an inverter (see FIG. 11B) and a latch (see FIG. 11C)), such a structure does not generate static current, and thus has an advantage of not only reducing offset but also reducing a power overhead.

FIGS. 12 and 13 are diagrams showing tables obtained by comparing the characteristics of an IOSA circuit according to one embodiment of the present invention with the characteristics of a sense amplifier circuit according to the related art.

The IOSA circuit of the present invention has several major features compared to a conventional OC-IOSA circuit. First, in terms of offset reduction, in the OC-IOSA circuit, an offset of a non-OC TR is not considered, but in the IOSA circuit of the present invention, the influence of the offset may be reduced through PS.

Further, in the OC-IOSA circuit, input attenuation occurs during an input coupling process, whereas in the IOSA circuit of the present invention, such a problem does not occur because an input is directly transmitted to the source of a PMOS.

Second, in terms of area reduction, in the OC-IOSA circuit, a large MOSCAP is used for input coupling, whereas in the IOSA circuit of the present invention, a small MOSCAP is used while directly transmitting the input. Accordingly, an overall area of a circuit is reduced.

Third, in terms of power consumption, in the conventional OC-IOSA circuit, there was a problem in that static current was generated because a gate voltage was not fully driven while MOSCAP coupling was used in an MS process. However, in the IOSA circuit of the present invention, such a problem is solved by disconnecting a MOSCAP connection so that a gate voltage may be fully driven during an MS process. Further, static current does not flow during a PS process, and thus a power overhead is reduced.

Lastly, in terms of sensing time, in the OC-IOSA circuit, a long time is required for OC because a large MOSCAP is used, but in the IOSA circuit of the present invention, a time required for OC may be reduced because a small MOSCAP is used. Further, instead of performing an input phase separately, the input phase may be performed simultaneously with the PD and PS phases, thereby reducing a sensing time overhead.

Figure 14:
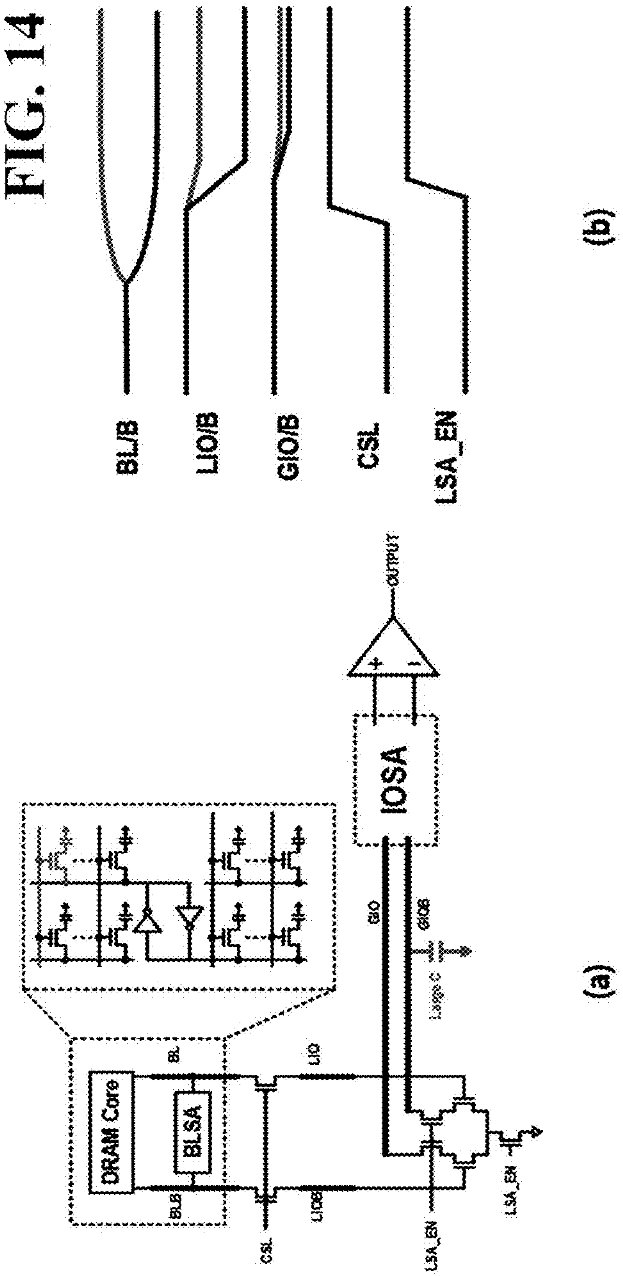
FIG. 14 is a set of diagrams showing a configuration of a semiconductor memory device including an input/output sense amplifier circuit according to one embodiment of the present invention.

FIG. 14 is a set of diagrams showing a configuration of a semiconductor memory device including an IOSA circuit according to one embodiment of the present invention.

FIG. 14A is a diagram showing the configuration of the semiconductor memory device including the IOSA circuit according to one embodiment of the present invention, and FIG. 14B is a diagram showing waveforms of bit lines according to an operation of the semiconductor memory device shown in FIG. 14A.

According to the present invention, the semiconductor memory device may include a BLSA circuit, a local sense amplifier (LSA) circuit, and an IOSA circuit.

The BLSA circuit may amplify memory cell data.

The LSA circuit may receive the memory cell data amplified by the BLSA circuit through a local input/output (LIO) line LIOB/LIO, sense data of the LIO line, and provide the sensed data to a GIO line GIOB/GIO.

The IOSA circuit may receive data from the LSA circuit through the GIO line, operate using a MOSCAP, sense data of the GIO line, and provide the sensed data to the outside of the semiconductor memory device. The IOSA circuit may be as described with reference to FIGS. 1 to 13.

A read operation of the semiconductor memory device to which the present technology is applied may include the following overall process. First, data of a DRAM cell may be amplified using a BLSA. The amplified data may be transmitted to the LIO line through a column select line (CSL).

Thereafter, the LSA may sense data of the LIO line and transmit the sensed data to the GIO line.

Finally, the IOSA circuit may sense data of the GIO line and transmit the sensed data to the outside of the DRAM.

In the operation of the IOSA circuit, a line GIO/B is in a pre-charge state with a voltage VDD.

The LSA drives a long GIO line to transmit an input. Since the capacitance of the GIO line is large, a small voltage swing may be used. The IOSA is required to amplify this small voltage swing and transmit data to the outside of the DRAM. This process allows efficient transmission and amplification of data.

As described above, according to one embodiment of the present invention, by applying an IOSA circuit and a semiconductor memory device including the same, it is possible to eliminate input attenuation and reduce an area of a circuit by connecting an input directly to the source of a PMOS and connecting one small MOSCAP between two gates of the PMOS to which an input is connected.

Further, according to one embodiment of the present invention, by applying the IOSA circuit and the semiconductor memory device including the same, it is possible to reduce a time required for OC and reduce a sensing time.

Even effects that are not explicitly described herein and provisional effects expected from the technical features of the present invention are treated as described in the specification of the present invention.

Other similar or dissimilar changes are possible within the scope that does not depart from the technical idea of the present invention. Therefore, the technical idea of the present invention may be claimed in other ways as well as the appended claims.

The above description is only an example describing the technical spirit of the present invention. Various changes, modifications, and replacements may be made without departing from the spirit and scope of the present invention by those skilled in the field of medical devices. Therefore, the embodiments disclosed in the present invention and the accompanying drawings should be considered in a descriptive sense only and not for limiting the technological scope. The technical spirit of the present invention is not limited by these embodiments and the accompanying drawings. It should be understood that the scope of the present invention is interpreted according to the appended claims and encompasses all equivalent technological scopes.

LIST OF REFERENCE SYMBOLS

100: input/output sense amplifier circuit
111: 1-1 transistor
112: 1-2 transistor
120: metal-oxide-semiconductor capacitor
133: 2-1 node
134: 2-2 node

The invention claimed is:

1. An input/output sense amplifier circuit in a sense amplifier circuit, comprising:
- a 1-1 transistor having a source connected to a first global input/output line;
- a 1-2 transistor having a source connected to a second global input/output line; and
- a metal-oxide semiconductor capacitor (MOSCAP) configured to connect a gate of the 1-1 transistor to a gate of the 1-2 transistor.

2. The input/output sense amplifier circuit of claim 1, further comprising:
- a 2-1 transistor configured to connect the MOSCAP to the 1-1 transistor through a 1-1 node connected to the gate of the 1-1 transistor; and
- a 2-2 transistor configured to connect the MOSCAP to the 1-2 transistor through a 1-2 node connected to the gate of the 1-2 transistor.

3. The input/output sense amplifier circuit of claim 2, further comprising:
- a 1-1 switch configured to connect or disconnect a 2-1 node connected to a drain of the 1-1 transistor to or from the 1-1 node; and
- a 1-2 switch configured to connect or disconnect a 2-2 node connected to a drain of the 1-2 transistor to or from the 1-2 node.

4. The input/output sense amplifier circuit of claim 3, further comprising:
- a 2-1 switch configured to connect or disconnect a 3-2 node located between the 1-2 node and the 1-2 switch to or from the 2-1 node; and
- a 2-2 switch configured to connect or disconnect a 3-1 node located between the 1-1 node and the 1-1 switch to or from the 2-2 node.

5. The input/output sense amplifier circuit of claim 4, further comprising:
- a 3-1 transistor having a gate connected to the 2-2 node and a source connected to the 2-1 node; and
- a 3-2 transistor having a gate connected to the 2-1 node and a source connected to the 2-2 node.

6. The input/output sense amplifier circuit of claim 5, wherein a drain of the 3-1 transistor and a drain of the 3-2 transistor are connected through a fourth node,
- the fourth node is connected to a source of a fifth transistor, and
- a drain of the fifth transistor is connected to a ground.

7. The input/output sense amplifier circuit of claim 6, further comprising:
- a 4-1 transistor having a source connected to the 2-1 node and a drain connected to the ground; and
- a 4-2 transistor having a source connected to the 2-2 node and a drain connected to the ground.

8. The input/output sense amplifier circuit of claim 7, wherein the 1-1 transistor is connected to the first global input/output line through a 5-1 transistor connected to the source of the 1-1 transistor, and
- the 1-2 transistor is connected to the second global input/output line through a 5-2 transistor connected to the source of the 1-2 transistor.

9. The input/output sense amplifier circuit of claim 8, wherein the 4-1 transistor is a transistor having a different channel type from the 5-1 transistor, and
- the 4-2 transistor is a transistor having a different channel type from the 5-2 transistor.

10. The input/output sense amplifier circuit of claim 9, wherein a gate of the 4-1 transistor, a gate of the 4-2 transistor, a gate of the 5-1 transistor, and a gate of the 5-2 transistor receive the same signal.

11. A semiconductor memory device comprising:
- a bit line sense amplifier circuit configured to amplify memory cell data;
- a local sense amplifier circuit configured to receive the memory cell data amplified by the bit line sense amplifier circuit through a local input/output line, sense data of the local input/output line, and provide the sensed data to a global input/output line; and
- an input/output sense amplifier circuit configured to receive data from the local sense amplifier circuit through the global input/output line, operate using a metal-oxide-semiconductor capacitor (MOSCAP), sense data of the global input/output line, and provide the sensed data to the outside of the semiconductor memory device.

12. The semiconductor memory device of claim 11, further comprising:
- a 1-1 transistor having a source connected to a first global input/output line;
- a 1-2 transistor having a source connected to a second global input/output line; and
- a MOSCAP configured to connect a gate of the 1-1 transistor to a gate of the 1-2 transistor.

13. The semiconductor memory device of claim 12, further comprising:
- a 1-1 switch configured to connect or disconnect a 2-1 node connected to a drain of the 1-1 transistor to or from a 1-1 node; and
- a 1-2 switch configured to connect or disconnect a 2-2 node connected to a drain of the 1-2 transistor to or from a 1-2 node.

14. The input/output sense amplifier circuit of claim 8, further comprising a controller configured to control the input/output sense amplifier circuit,
- wherein the controller turns off the 5-1 transistor and the 5-2 transistor,
- turns on the 1-1 switch and the 1-2 switch,
- turns on the 4-1 transistor and the 4-2 transistor, and
- turns on the 2-1 transistor and the 2-2 transistor.

15. The input/output sense amplifier circuit of claim 8, further comprising a controller configured to control the input/output sense amplifier circuit,
- wherein the controller turns on the 1-1 switch and the 1-2 switch,
- turns on the 2-1 transistor and the 2-2 transistor,
- turns on the 5-1 transistor and the 5-2 transistor, and
- turns off the 4-1 transistor and the 4-2 transistor.

16. The input/output sense amplifier circuit of claim 8, further comprising a controller configured to control the input/output sense amplifier circuit, wherein the controller turns on the 2-1 transistor and the 2-2 transistor, turns off the 1-1 switch and the 1-2 switch, turns off the 5-1 transistor and the 5-2 transistor, and turns on the 4-1 transistor and the 4-2 transistor.

17. The input/output sense amplifier circuit of claim 8, further comprising a controller configured to control the input/output sense amplifier circuit, wherein the controller turns on the 2-1 transistor and the 2-2 transistor, turns off the 1-1 switch and the 1-2 switch, turns on the 5-1 transistor and the 5-2 transistor, and turns off the 4-1 transistor and the 4-2 transistor.

18. The input/output sense amplifier circuit of claim 8, further comprising a controller configured to control the input/output sense amplifier circuit, wherein the controller turns off the 2-1 transistor and the 2-2 transistor, turns off the 1-1 switch and the 1-2 switch, turns on the 5-1 transistor and the 5-2 transistor, turns off the 4-1 transistor and the 4-2 transistor, turns on the 2-1 switch and the 2-2 switch, turns on the 3-1 transistor and the 3-2 transistor, and turns on the fifth transistor.

* * * * *